United States Patent
Bui et al.

(10) Patent No.: US 11,669,428 B2
(45) Date of Patent: Jun. 6, 2023

(54) DETECTION OF MATCHING DATASETS USING ENCODE VALUES

(71) Applicant: PayPal, Inc., San Jose, CA (US)

(72) Inventors: Kim Dung Bui, Singapore (SG); Chun Kiat Ho, Singapore (SG); Lin Song, Singapore (SG); Kai Xie, Singapore (SG)

(73) Assignee: PayPal, Inc., San Jose, CA (US)

( * ) Notice: Subject to any disclaimer, the term of this patent is extended or adjusted under 35 U.S.C. 154(b) by 301 days.

(21) Appl. No.: 16/878,429

(22) Filed: May 19, 2020

(65) Prior Publication Data

US 2021/0365344 A1 Nov. 25, 2021

(51) Int. Cl.
*G06F 11/30* (2006.01)
*G06F 11/34* (2006.01)
*H03M 7/30* (2006.01)
*G06N 20/00* (2019.01)
*G06F 17/18* (2006.01)

(52) U.S. Cl.
CPC .............. *G06F 11/34* (2013.01); *G06F 17/18* (2013.01); *G06N 20/00* (2019.01); *H03M 7/3082* (2013.01); *H03M 7/3084* (2013.01); *H03M 7/6011* (2013.01)

(58) Field of Classification Search
CPC ........ G06F 11/34; G06F 17/18; G06F 16/215; G06N 20/00; G06N 3/126; G06N 7/005; G06N 3/0454; H03M 7/3082; H03M 7/3084; H03M 7/6011
See application file for complete search history.

(56) References Cited

U.S. PATENT DOCUMENTS 5,371,499 A * 12/1994 Graybill .............. H03M 7/3086
341/51
10,642,715 B1 5/2020 Simca et al.
(Continued)

OTHER PUBLICATIONS

Alberto Bartoli et al., "Inference of Regular Expressions for Text Extraction from Examples," IEEE Transactions on Knowledge and Data Engineering, vol. 28, No. 5, May 2016, pp. 1217-1230.
(Continued)

*Primary Examiner* — Tuan C Dao
(74) *Attorney, Agent, or Firm* — Kowert, Hood, Munyon, Rankin & Goetzel, P.C.; Gentry C. McLean; Dean M. Munyon

(57) ABSTRACT

Techniques are disclosed relating to detecting matching datasets using encode values. In various embodiments, a data monitoring system may perform encoding operations on a first dataset to generate a first encode value that corresponds to a particular one of one or more fields included in the first dataset. The data monitoring system may then determine whether the first dataset matches a previously analyzed dataset. For example, in some embodiments, data monitoring system may compare the first encode value to a previous encode value that corresponds to a second field of the previously analyzed dataset. Based on this comparison, the data monitoring system may generate an output value that is indicative of a similarity between the first encode value and the previous encode value. The data monitoring system may then determine whether the first dataset matches the previously analyzed dataset based on this output value.

20 Claims, 8 Drawing Sheets

(56) References Cited

U.S. PATENT DOCUMENTS

| | | | | |
|---|---|---|---|---|
| 2004/0049498 | A1* | 3/2004 | Dehlinger | G06F 40/30 |
| 2004/0210763 | A1* | 10/2004 | Jonas | H04L 63/102 |
| | | | | 713/193 |
| 2005/0060643 | A1* | 3/2005 | Glass | G06F 40/169 |
| | | | | 715/205 |
| 2006/0215875 | A1* | 9/2006 | LeComte | H04N 19/63 |
| | | | | 348/E7.071 |
| 2011/0087669 | A1* | 4/2011 | Ancin | G06F 16/325 |
| | | | | 707/E17.089 |
| 2011/0093426 | A1* | 4/2011 | Hoglund | H04L 9/3239 |
| | | | | 706/52 |
| 2013/0262873 | A1* | 10/2013 | Read | H04L 63/0861 |
| | | | | 713/186 |
| 2014/0241421 | A1* | 8/2014 | Orton-Jay | H04N 19/436 |
| | | | | 375/240.03 |
| 2014/0373148 | A1* | 12/2014 | Nelms | H04L 63/1441 |
| | | | | 726/23 |
| 2015/0074743 | A1* | 3/2015 | Ilieva | H04L 63/104 |
| | | | | 726/4 |
| 2015/0244795 | A1 | 8/2015 | Cantwell et al. | |
| 2016/0078339 | A1* | 3/2016 | Li | G06N 3/084 |
| | | | | 706/20 |
| 2016/0285473 | A1* | 9/2016 | Kim | H03M 7/6023 |
| 2017/0286544 | A1* | 10/2017 | Hunt | H04L 63/1483 |
| 2018/0218356 | A1* | 8/2018 | Grassadonia | G06Q 20/322 |
| 2018/0338147 | A1* | 11/2018 | Nowozin | H04N 19/94 |
| 2018/0357447 | A1 | 12/2018 | Chen et al. | |
| 2020/0104587 | A1 | 4/2020 | Bhatnagar et al. | |
| 2020/0402672 | A1 | 12/2020 | Michelson et al. | |
| 2020/0410322 | A1 | 12/2020 | Naphade et al. | |

OTHER PUBLICATIONS

Chapter 14 Autoencoders; https://www.deeplearningbook.org > contents > autoencoders, pp. 499-523.

Bo Zong et al., "Deep Autoencoding Gaussian Mixture Model for Unsupervised Anomaly Detection," Published as a conference paper at ICLR 2018, 19 pages.

Pieter-Tjerk de Boer et al., "A Tutorial on the Cross-Entropy Method," Annals of Operations Research, last updated: Sep. 2, 2003, 47 pages.

Apache Avro 1.9.1 Documentation, The Apache Software Foundation, last published Sep. 2, 2019; avro.apache.org/docs/current/; retrieved Dec. 30, 2019, 2 pages.

Developer Guide | Protocol Buffers | Google Developers; https://developers.google.com/protocol-buffers/docs/overview; retrieved Dec. 30, 2019, 5 pages.

Tomas Mikolov et al., "Distributed Representations of Words and Phrases and their Compositionality," https://arxiv.org/abs/1310.4546v1; Oct. 16, 2013, 9 pages.

Encoding | Protocol Buffers | Google Developers; https://developers.google.com/protocol-buffers/docs/encoding#embedded; retrieved Dec. 30, 2019, 6 pages.

Euclidean distance, Wikipedia.com, last edited on Dec. 12, 2019, 3 pages.

Jensen-Shannon divergence, Wikipedia.com, last edited on Nov. 15, 2019, 6 pages.

S. Kullback et al., "On Information and Sufficiency," The Annals of Mathematical Statistics; jstor.org, pp. 79-86.

Regular expression, Wikipedia.com, last edited on Dec. 30, 2019, 27 pages.

Wasserstein metric, Wikipedia.com, last edited on Dec. 19, 2019, 4 pages.

Word embedding, Wikipedia.com, last edited on Dec. 5, 2019, 5 pages.

Blei et al., "Latent Dirichlet Allocation," Journal of Machine Learning Research 3 (2003), pp. 993-1022.

Wikipedia, Latent Dirichlet Allocation; https://en.wikipedia.org/wlindex.php?title=Latent_Dirichlet_allocation&oldid=953599124; last edited on Apr. 28, 2020, 8 pages.

Wikipedia, Nearest neighbor search (NNS); https://en.wikipedia.org/wiki/Nearest_neighbor_search; last edited on Apr. 15, 2020; 8 pages.

* cited by examiner

500

Perform encoding operations on a first dataset to generate a first encode value, where the first dataset includes a first plurality of fields, and where the first encode value corresponds to a particular field of the first plurality of fields
502

Determine whether the first dataset matches a previously analyzed dataset, where the previously analyzed dataset includes a second plurality of fields, wherein the determining includes:
504

Comparing the first encode value to a previous encode value that corresponds to a second field, of the second plurality of fields, of the previously analyzed dataset
506

Based on the comparing, generating an output value that is indicative of a similarity between the first encode value and the previous encode value
508

Based on the output value, determining whether the first dataset matches the previously analyzed dataset
510

FIG. 5

DETECTION OF MATCHING DATASETS USING ENCODE VALUES

BACKGROUND

Technical Field

This disclosure relates generally to data quality and, more particularly, to detecting matching datasets using encode values.

Description of the Related Art

A server system (e.g., multi-datacenter system) may utilize various datasets and store these datasets at multiple locations, such as data stores at multiple datacenters. A dataset may contain a large amount of data. For example, in some instances, a given dataset may have billions of data records (e.g., 3-5 billion), any of which may have data values for numerous fields in the dataset. In some instances, users (e.g., data scientists) may design and create datasets for use in analytical operations, which may provide numerous benefits for the server system as a whole or the web services it provides. In many instances, however, it may be difficult for the user to know whether a desired dataset is already maintained by (or accessible to) the system or whether the user will need to be created, presenting various technical problems. For example, in many instances, creating a dataset for use in analytical operations is both a time- and labor-intensive task. Additionally, maintaining redundant datasets wastes computing resources that the server system could otherwise use to improve the performance of the web services it provides.

BRIEF DESCRIPTION OF THE DRAWINGS

FIGS. 5 and 6 are flow diagrams illustrating example methods for determining whether a new dataset matches one or more previously analyzed datasets using encode values, according to some embodiments.

DETAILED DESCRIPTION

Figure 1:
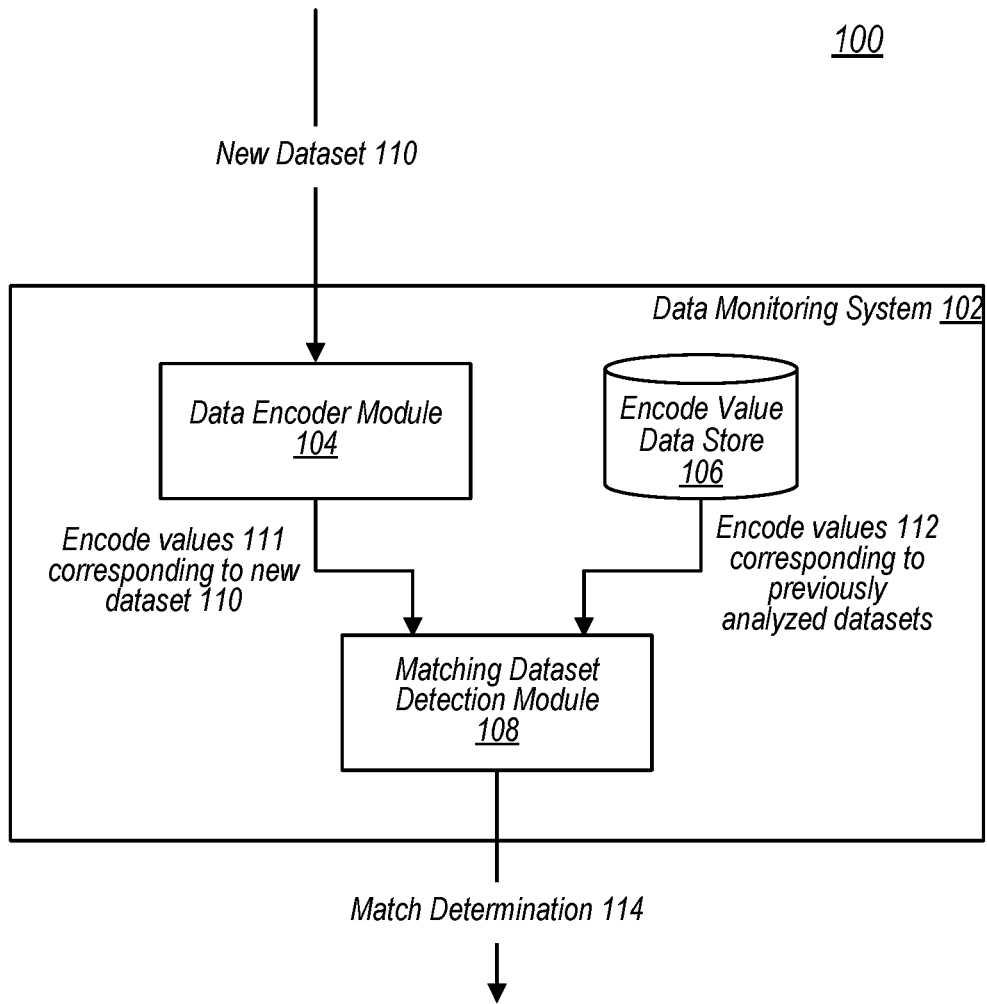
FIG. 1 is a block diagram illustrating an example data monitoring system, according to some embodiments.

To provide web services, a server system (e.g., multi-datacenter system) may utilize various datasets and store these datasets at multiple locations, such as data stores at multiple datacenters. For example, a dataset may be replicated at a database at a production datacenter to service requests from client devices and to a database at a non-production datacenter for use in simulations and analytics operations. A dataset may contain a large amount of data. For example, in some instances, a given dataset may have billions of data records (e.g., 3-5 billion), each of which may have data values for numerous fields in the dataset. In some instances, data scientists may design and create datasets for use in analytical operations, which may provide numerous benefits for the server system as a whole or the web services it provides. As one non-limiting example, data scientists may use one or more datasets to perform analytical operations designed to detect fraud or other malicious activity attempted on the system, allowing such malicious activities to be identified and prevented more effectively in the future.

In many instances, however, it may be difficult for the user (e.g., a data scientist) to know whether a desired dataset is already maintained by (or accessible to) the system or whether the user will need to create the dataset herself. This presents various technical problems. For example, creating datasets is an important and time-consuming task in data analytics projects, such as training and testing machine learning models. In some instances—and particularly within organizations with multiple data scientists or data science groups—it is possible that a dataset that an analyst needs for her project is already present within the system. This situation becomes more common in the context of big data in which there may be a large number of datasets within a given system, with a large amount of data within any or all of those datasets. Due to the scale involved, it would be both infeasible and undesirable for a user to attempt to manually inspect the existing datasets in the system to determine whether the desired dataset already exists. Further, it is both a waste of the user's time and the system's resources (e.g., data storage) to recreate and store an entirely new dataset when the desired dataset (or at least a portion thereof) is already stored within the system. Additionally, storing and maintaining redundant copies of a datasets wastes computing resources (e.g., storage space) that could otherwise be utilized to improve performance and capabilities of the server system and the web services it provides.

Prior techniques for detecting overlapping or redundant (e.g. duplicate) data present numerous technical shortcomings for detecting overlapping or redundant datasets. For example, prior data-monitoring systems are only able to detect duplication on the data record level, rather than on the dataset level due, in part, to the large size of the datasets involved. Further, hash-based techniques for detecting duplicate data are not practical or effective, as any changes between the two datasets (e.g., a difference for one data value in a dataset having thousands or millions of records, or a different ordering of data records in the datasets, despite the data records themselves being the same) would result in different hash values and, accordingly, such hash-based techniques would fail to recognize these two datasets as a match.

In various embodiments, the techniques disclosed herein may solve these and other technical problems by detecting matching datasets using encode values. More specifically, in various embodiments, the disclosed techniques may be used to determine whether a new dataset (e.g., a dataset that is being created by a data scientist or other user) matches a previous dataset (e.g., a dataset already maintained by or accessible to the system) by comparing encode values generated based on the new dataset to encode values generated based on the previous dataset. For example, in various embodiments, a data monitoring system performs encoding operations on a new dataset to generate a set of encode values for the new dataset. As described in more detail below with reference to FIGS. 3 and 4, the data monitoring system may generate the encode values for the new dataset based on the data types of the fields included in the new dataset. As a non-limiting example, if a new dataset includes a field that stores numerical data, the data monitoring system may use a numerical distribution encoder module to generate a numerical distribution encode value for that field. Once it has generated the encode values for the new dataset, the data monitoring system, in various embodiments, determines whether the new dataset matches an existing dataset by comparing the set of encode values for the new dataset to encode values for previously analyzed datasets. Based on this comparison, the data monitoring system may generate an output value (e.g., a "similarity score") that indicates a similarity between the encode values of the new dataset and a previously analyzed dataset and, based on this similarity score, the data monitoring system may then determine whether the new dataset matches the previously analyzed dataset.

As used herein, two datasets may be said to "match" if, when comparing one or more encode values generated based on the two datasets, the one or more corresponding similarity scores satisfy a "similarity criterion." The process of determining whether two datasets "match" based on one or more similarity scores, according to some embodiments, is described in more detail below with reference to FIG. 4. Note, however, that the "similarity criterion" may vary between different embodiments of the disclosed systems and methods. Consider, for example, an instance in which the disclosed techniques are used to determine whether a first dataset, Dataset A, matches a second dataset, Dataset B. In one non-limiting embodiment, the disclosed techniques may be used to generate two encode values for each of these datasets (e.g., encode values EA1 and EA2 corresponding to Dataset A and encode values EB1 and EB2 corresponding to Dataset B), compare the encode values for Dataset A to the encode values for Dataset B, and generate two corresponding similarity scores. In some such embodiments, the similarity scores may satisfy the similarity criterion if a single one of the similarity scores exceeds a particular threshold value. In other embodiments, the similarity scores may satisfy the similarity criterion only if both similarity scores exceed respective threshold values. Further note that the term "match" is not limited to situations in which one dataset is an exact duplicate of another. Instead, a first dataset may be considered to "match" a second dataset in instances in which the first dataset is a subset of the existing dataset, a superset of the existing dataset, etc.

Accordingly, in various embodiments, the techniques described herein may solve technical problems in the art by detecting matching at the dataset level using encode values. In various embodiments, the disclosed techniques improve the speed and efficacy with which matching datasets are identified, which is particularly beneficial in organizations in which there are multiple data scientists or data science groups and there are many previously generated datasets available within the system. This, in turn, saves both time for the users (e.g., data scientists) and storage space that would otherwise be wasted storing redundant or overlapping datasets, thereby improving the functioning of the system as a whole.

Referring now to FIG. 1, a block diagram is depicted of a system 100 that includes an example data monitoring system 102, which, in the depicted embodiment, includes data encoder module 104, encode value data store 106, and matching dataset detection module 108. In various embodiments, data monitoring system 102 is operable to detect matching datasets using encode values. For example, as noted above, a data scientist may use data monitoring system 102 while creating a dataset (e.g., early within the process of creating a dataset) to determine if there are any existing datasets in (or accessible to) the system that match the desired dataset. Note, however, that this embodiment is provided merely as a non-limiting example and that the disclosed techniques may be applied at any stage of the data lifecycle to determine whether a particular dataset matches a previously analyzed dataset. For example, in some embodiments, the disclosed techniques may be used to identify and delete redundant datasets to preserve storage space within the various data stores in system 100.

In FIG. 1, data monitoring system 102 receives and performs validation operations on a dataset 110. In various embodiments, dataset 110 may be a new dataset (or a portion of a dataset) that has been created by a data scientist who wants to determine whether there are matching datasets already maintained by (or accessible to) the system in which the data monitoring system 102 operates. In various embodiments, data monitoring system 102 is operable to make this determination using encode values corresponding to both the new dataset 110 and the previously analyzed datasets in the system 100. For example, data encoder module 104 may generate one or more encode values 111 based on the fields included in new dataset 110. As explained in more detail below, matching dataset detection module 108 may retrieve (e.g., from encode value data store 106) encode values 112 corresponding to one or more previously analyzed datasets and compare the encode values to determine whether the new dataset 110 matches any of the previously analyzed datasets.

As used herein, the term "encode value" refers to data that is generated based on data from datasets that are (or were) included in or accessible to the system 100. Note that the format or content of the encode values may vary based on the particular fields included in a dataset and the data types of those fields, according to different embodiments. As described in more detail below with reference to FIG. 3, data monitoring system 102 may include various encoder modules that are operable to generate encode values that are usable, by matching dataset detection module 108, to determine whether the new dataset 110 matches a previously analyzed dataset. In some embodiments, for example, the data monitoring system 102 includes an encoder module that is operable to generate "schema encode values," which the data monitoring system 102 may use to compare a schema associated with new dataset 110 to the schema of previously analyzed datasets. Further, in some embodiments, the data monitoring system 102 includes an encoder module that is operable to generate "update pattern encode values," which the data monitoring system 102 may use to compare an update pattern associated with data records in new dataset 110 to the update pattern associated with data records in previously analyzed datasets. In some embodiments, the data monitoring system 102 includes an encoder module that is operable to generate "distribution encode values," which the data monitoring system 102 may use to compare one or more value distributions associated with data in new dataset 110 to value distributions associated with data in previously analyzed datasets. In some embodiments, the data monitoring system 102 includes an encoder module that is operable to generate "value-format encode values," which the data monitoring system 102 may use to compare a format of string-type data in a particular field of new dataset 110 to a format of string-type data included in one or more fields of previously analyzed datasets. Additionally, in some embodiments, the data monitoring system 102 includes an encoder module that is operable to generate "semantic encode values," which the data monitoring system 102 may use to compare the semantic content of string-type data in a particular field of new dataset 110 to the semantic content of string-type data in one or more fields of previously analyzed datasets. In various embodiments, the term "encode value" refers to data that includes at least one of a schema encode value, an update pattern encode value, a distribution encode value, a value-format encode value, or a semantic encode value.

Note that, in some embodiments, an encode value may correspond to one or more latent variables associated with a dataset from which the encode value was generated. For example, in some embodiments, an encode value may include a latent probability distribution of numerical data values in a dataset. In other embodiments, an encode value may include a statistical model built using data from one or more datasets. For example, in some embodiments, an encode value may include a trained machine learning model (such as an autoencoder) that was generated based on data from existing datasets that are (or were) maintained by the system 100. Further, in some embodiments, an encode value may include data generated as part of the process of training a machine learning model, such as a latent space representation of a dataset. For example, in some embodiments, data monitoring system 102 may train one or more autoencoder machine learning models based on existing datasets in the system 100. In some such embodiments, the encode values 112 corresponding to the previously analyzed datasets may include either the trained autoencoders or the latent space representation of the dataset(s) that has a lower dimensionality than the original dataset(s).

As described in more detail below with reference to FIGS. 4 and 6-7, matching dataset detection module 108, in various embodiments, is operable to compare encode values 111, corresponding to the new dataset 110, to encode values 112, corresponding to one or more previously analyzed datasets, to determine whether the new dataset 110 matches any of the previously analyzed datasets. Based on this comparison, matching dataset detection module 108 is operable to generate a match determination 114 indicating whether the new dataset matches a previously analyzed dataset and, if so, information identifying the previously analyzed dataset (e.g., a path to the previously analyzed dataset within a data store of the system) or the nature of the match between the datasets (e.g., new dataset 110 is an exact duplicate, a subset, a superset, etc.), according to some embodiments. Further, in some embodiments, match determination 114 may be provided to a user (e.g., via data monitoring user interface (UI)) or used to automatically initiate one or more operations (e.g., retrieving the previously analyzed dataset for inspection by the user, etc.).

Figure 2:
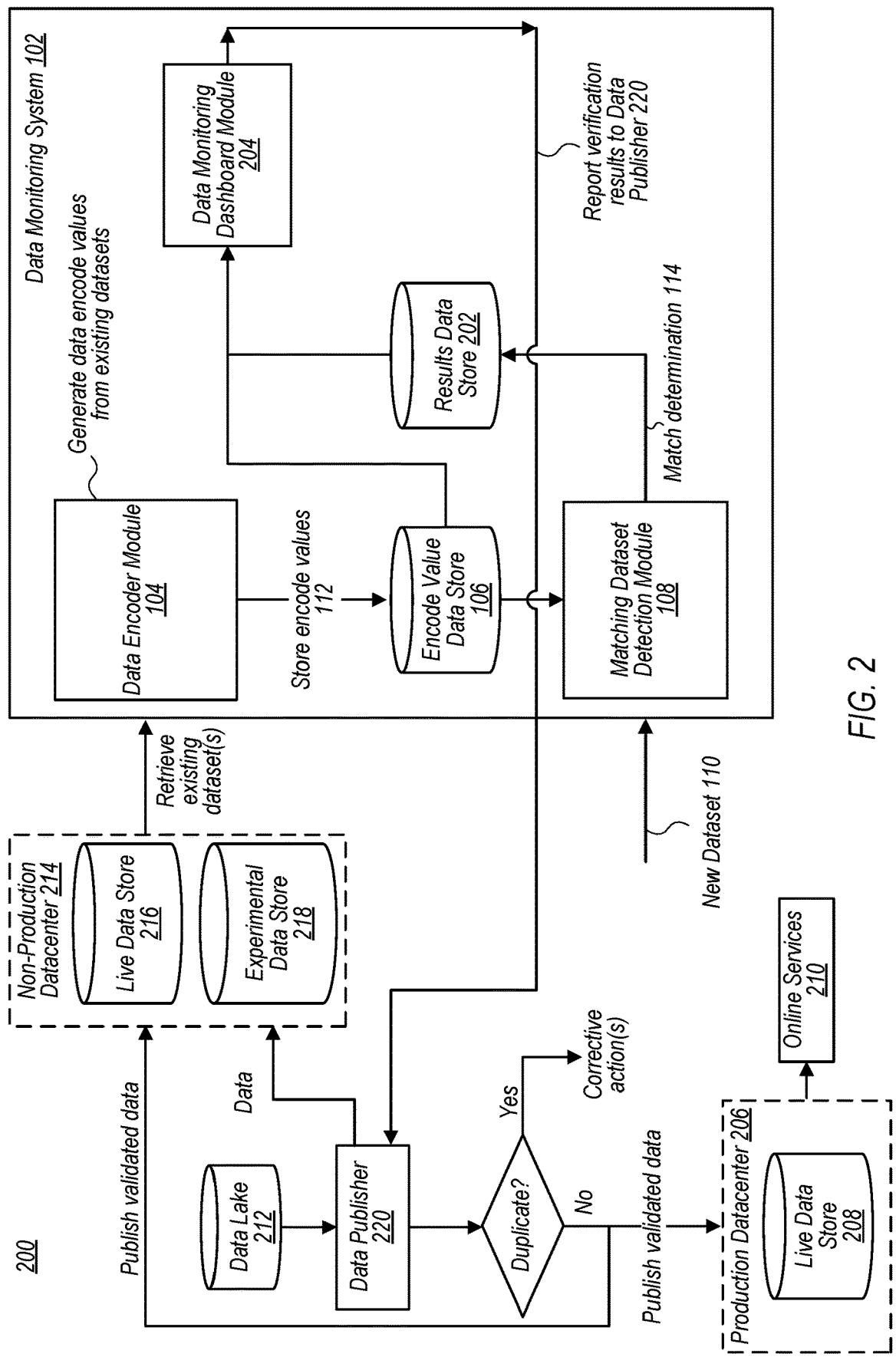
FIG. 2 is a block diagram illustrating an example system that includes a data monitoring system, according to some embodiments.

FIG. 2 depicts a block diagram of an example system 200 in which the disclosed techniques may be implemented, according to some embodiments. FIG. 2 depicts a more detailed diagram of data monitoring system 102, which, in the depicted embodiment, includes matching dataset detection module 108, data encoder module 104, encode value data store 106, results data store 202, and data monitoring dashboard module 204.

In various embodiments, data monitoring system 102 performs both "offline" operations and "online" operations. In the offline operations, data encoder module 104 may retrieve existing datasets and perform various encoding operations to generate encode values 112. For example, in the embodiment depicted in FIG. 2, data encode module 104 retrieves existing datasets from the live data store 216 at non-production datacenter 214. Note that, as used herein, the term "non-production" datacenter refers to a datacenter that is used primarily to perform testing, simulations, or other analytical operations. The term "production" datacenter, such as production datacenter 206 of FIG. 2, refers to a datacenter that is used primarily to host software applications and serve online traffic from end users (e.g., users of online services 210). (Note, however, that production datacenters may also be used to perform operations other than servicing online traffic, such as performing analytical operations, and that non-production datacenters may be used to perform operations other than testing and simulations. The terms "production" and "non-production" are simply used herein to denote a significant or common function performed by the respective datacenters.) In various embodiments, the datasets retrieved from the live data store 216 may include datasets that were previously validated or that are already being used to support online services 210. In various embodiments, the disclosed techniques may be used to determine whether a new dataset 110 matches a dataset from a live data store (e.g., live data store 208 of production datacenter 206 or live data store 216 of non-production datacenter 214) or an experimental data store (e.g., experimental data store 218 of non-production datacenter 214).

Once it receives the datasets (e.g., from the live data store 216 or any other suitable data store within or external to the system 200), data encoder module 104 is operable to perform various encoding operations to generate one or more encode values 112. The encoding operations performed by data encoder module 104 are described in more detail below with reference to FIG. 3. Through these encoding operations, data encoder module 104 is operable to generate various encode values 112, according to various embodiments. Non-limiting examples of encode values 112 include: trained machine learning models, schema metadata, update pattern information, value distributions, vector word-embedding representations of data in the datasets, regular expressions corresponding to the existing datasets, etc. Once generated, data encoder module 104 may store the encode values 112 in encode value data store 106 for subsequent use by the matching dataset detection module 108.

During the "online" operations, matching dataset detection module 108 is operable to use the encode values 112 to determine whether new dataset 110 matches any of the previously analyzed datasets (stored, for example, in live data store 208 at the production datacenter 206 or live data store 216 at the non-production datacenter 214). For example, as shown in FIG. 2, system 200 includes data publisher 220, which is operable to publish data (e.g., from data lake 212) to experimental data store 218 at the non-production datacenter 214. In various embodiments, data may be temporarily stored in experimental data store 218 until it is validated (e.g., as described in more detail in U.S. application Ser. No. 16/816,778, filed on Mar. 12, 2020, which is hereby incorporated by reference as if entirely set forth herein). Further, in various embodiments, if it is determined that new dataset 110 does not match any of the previously analyzed datasets, data publisher 220 may store the new dataset 110 in one or more of the data stores of the system 200.

Various techniques for determining whether new dataset 110 matches a previously analyzed dataset are described below with reference to FIG. 3-7. As a non-limiting example, in some embodiments, matching dataset detection module 108 is operable to receive new dataset 110 (e.g., either in a streaming manner (that is, in real-time or near real-time) from a user or in a batch manner by retrieving the new dataset 110 from a data store (e.g., experimental data store 218) at predetermined intervals) and utilize the encode values 112 to determine whether the new dataset 110 matches a previously analyzed dataset. In various embodiments, matching dataset detection module 108 is operable to generate match determination 114 that indicates whether the new dataset matches a previously analyzed dataset. In various embodiments, matching dataset detection module 108 may store the match determination 114 in results data store 202.

In FIG. 2, data monitoring system 102 includes data monitoring dashboard module 204, which, in various embodiments, is operable to provide a data monitoring UI that a user may utilize to analyze the new dataset 110 and match determination 114. In various embodiments, the data monitoring dashboard module 204 is operable to provide visualization and reporting of data quality relating to various datasets in the system 200. For example, in various embodiments, the data monitoring dashboard module 204 is operable to provide (e.g., to a user via the data monitoring UI) a list of the datasets available and their corresponding encode values 112. In some embodiments, the distribution of data values in a dataset are plotted into any of various suitable diagrams. Further, in some embodiments, the data monitoring dashboard module 204 may include a results post-processor that is operable to further process and analyze match determinations 114 from the results data store 202. In various embodiments, the data monitoring dashboard module 204 is operable to push match determinations 114 to other external services (e.g., data publisher 220). For example, in various embodiments, match determinations 114 are sent to data publisher 220 automatically after the match-detection operations have been performed by data monitoring system 102.

As shown in FIG. 2, if the data monitoring system 102 determines that the new dataset 110 does not match any of the previously analyzed datasets, the new dataset 110 may be stored in one or more data stores, such as live data store 208 at production datacenter 206 (where it may be utilized by online services 210) or live data store 216 at non-production datacenter 214 (where it may be used in various analytical operations or by data encoder module 104 for future encoding operations). If, however, the data monitoring system 102 determines that the new dataset 110 matches one or more previously analyzed datasets, system 200 may perform one or more corrective actions. As a non-limiting example, in various embodiments, if the new dataset 110 is determined to match a previously analyzed dataset, the new dataset 110 may be flagged for manual review before it is stored in any other data stores. In instances in which it is determined that the new dataset 110 matches a previously analyzed dataset, the data monitoring dashboard module 204 is operable to send notifications (e.g., via email, SMS messaging, etc.) to various users associated with the data monitoring system 102 or the new dataset 110, according to some embodiments. Further, in some embodiments, the data monitoring dashboard module 204 is operable to provide an API for other external services to actively query for match determination 114.

Note that, in various embodiments, one or more of data encoder module 104, matching dataset detection module 108, and data monitoring dashboard module 204 may be implemented as microservices executed by various computer systems at one or more datacenters within the system 200. Additionally, note that, in some embodiments, the term "computer system" may refer to a single machine executing, for example, at a datacenter. In other embodiments, the term "computer system" may refer to multiple machines executing, for example at one or more datacenters, for the benefit of a single entity.

Further note that, in some instances, a given dataset used by the system 200 (e.g., stored in live data store 216) may vary over time and, as such, one or more of the corresponding encode values 112 for that dataset may need to be periodically updated. For example, as the records in a dataset are updated, the value distributions (e.g., the numerical distribution, etc.) of the data in that dataset may also change such that the previously generated encode values 112 for that dataset no longer accurately correspond to the data in that dataset. Accordingly, in some embodiments, data monitoring system 102 is operable to periodically re-calculate the encode values 112 for the existing datasets stored in the system 200 (e.g., stored in live data store 216). The frequency with which the encode values 112 for a given dataset are re-calculated may vary, according to different embodiments. For example, in some embodiments, encode values 112 for an existing dataset may be re-calculated at certain time intervals (e.g., every week, every two weeks, every month, etc.). In other embodiments, encode values 112 for an existing dataset may be re-calculated based on an amount of change to the dataset since the last time the encode values 112 for the dataset were calculated (e.g., once more than 10% of the records in a dataset have been updated in some way, as one non-limiting example). In some embodiments, once the data monitoring system 102 has re-calculated the encode values 112 for an existing dataset, it may then update those encode values 112 in the encode value data store 106 (or other suitable storage location) and compare these updated encode values 112 with other encode values 112 in the system to determine updated similarity scores.

Figure 3:
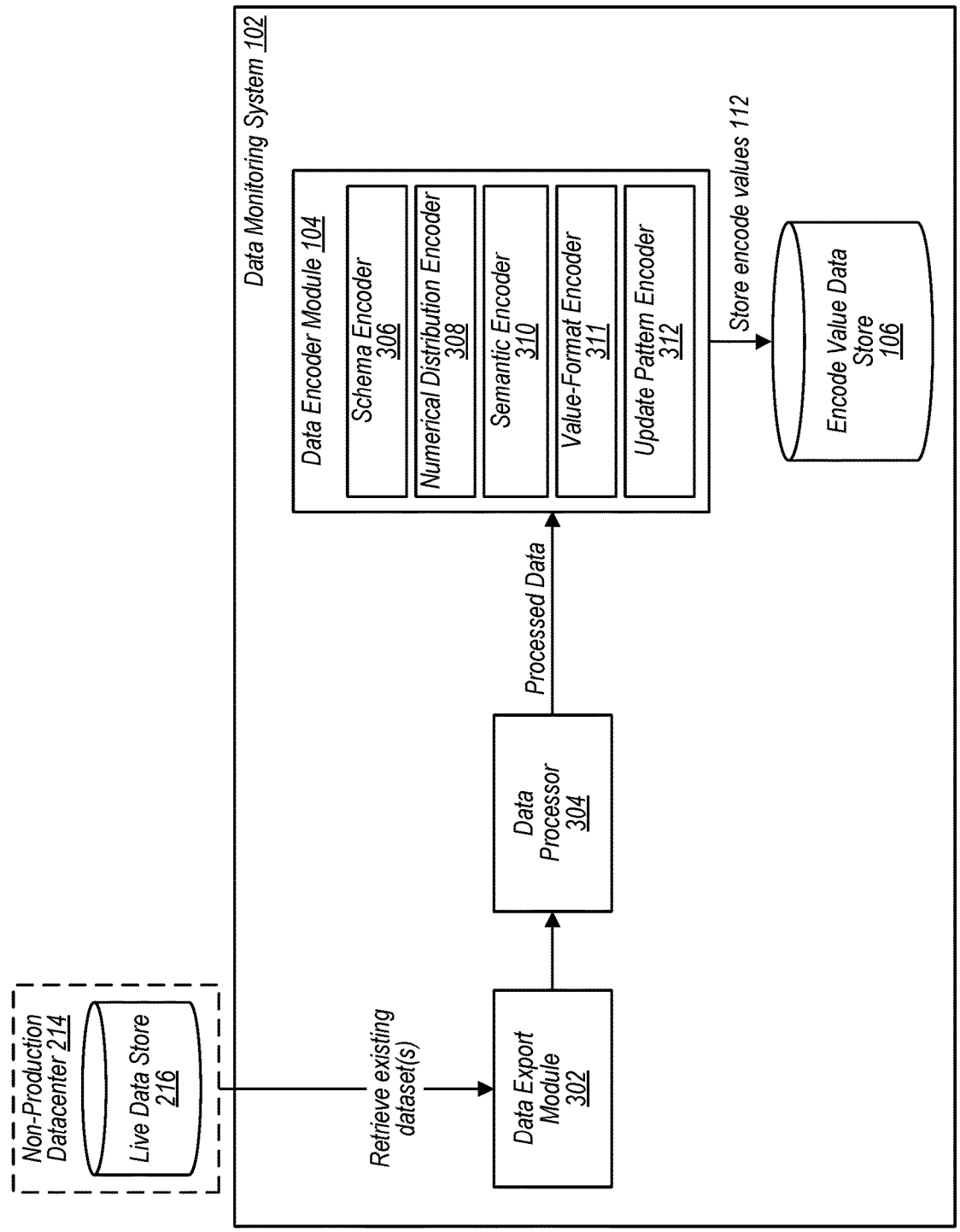
FIG. 3 is a block diagram illustrating an example data encoder module, according to some embodiments.

FIG. 3 depicts a block diagram with a more detailed view of data encoder module 104, according to some embodiments. As described in more detail below, data encoder module 104 includes various sub-modules that are operable to generate various encode values 112 that may be used, by matching dataset detection module 108, to determine whether a new dataset 110 matches any of the previously analyzed datasets, according to various embodiments.

In FIG. 3, data monitoring system 102 includes data export module 302, which is operable to retrieve existing datasets from live data store 216 (or any other suitable data store), in some embodiments. For example, in various embodiments, data export module 302 is operable to export datasets (or portions of datasets) from the live data store 216. In various embodiments, data export module 302 may operate in a batch mode (retrieving data from live data store 216 at predetermined time intervals) or in a streaming mode (retrieving data from the live data store 216 at or near the time that such data is added to the live data store 216). Data monitoring system 102, in the embodiment of FIG. 3, further includes data processor 304. In various embodiments, data processor 304 is operable to process the data retrieved by data export module 302 and convert it into one or more formats for input into the various encoder sub-modules of data encoder module 104. Non-limiting examples of the operations that may be performed by the data processor 304 include: cleaning empty data records, removing non-supported data type fields, removing quasi-numerical variables, etc.

Data monitoring system 102 further includes data encoder module 104, which is operable to generate one or more encode values based on data included in one or more fields of a dataset, such as an existing dataset retrieved from a data store in the system (e.g., from live data store 216 to generate encode values 112) or a new dataset 110 (e.g., when determining whether the new dataset 110 matches previously analyzed dataset). As used herein, the term "dataset" refers to a collection of data organized into one or more fields. In many instances, a dataset includes one or more fields and the data records in the dataset may include a data value for the one or more fields. The structure of an example dataset, Dataset A, is shown below:

| Id | Field Name | Field Data Type |
|---|---|---|
| 1 | EMAIL | String |
| 2 | APPS_GOOD | Integer |
| 3 | FIRST_SEEN | Datetime |
| 4 | RGT_CITY | String |

In this non-limiting example, each field has a corresponding id number, field name, and field data type. Table 1, below, shows an example data record with a data value for each of the fields of Dataset A:

TABLE 1

| EMAIL | APPS_GOOD | FIRST_SEEN | RGT_CITY |
|---|---|---|---|
| name@example.com | 1 | 2019 Jan. 1 | Singapore |

Data encoder module 104 of FIG. 3 includes five sub-modules, each of which is described in more detail below. In various embodiments, one or more of the sub-modules is operable to generate encode values based on a particular type of data in a dataset. As data for a given field is typically of the same data type, these encoders may be referred to as "data field encoders," which encode values characteristic of a specific field. For example, some sub-modules (such as value-format encoder 311 and semantic encoder 310) generate encode values based on string-type data in a dataset. Given the example Dataset A, above, for example, value-format encoder 311 and semantic encoder 310 would generate encode values for the "EMAIL" and "RGT_CITY" fields of Dataset A. Further, some sub-modules (such as numerical distribution encoder 308) generate encode values based on numerical data in a dataset. For Dataset A, for example, the numerical distribution encoder 308 would generate encode values for the "APPS_GOOD" field. An example of the field encoders that may, in some embodiments, be used (e.g., trained and built) for the fields of the example Dataset A are shown below in Table 2:

TABLE 2

| Field Name | Field Data Type | Example | Encoder Module Used | Example Encode Name |
|---|---|---|---|---|
| EMAIL | String | name@example.com | Value-format encoder 311 | EA1 |
| | | | Semantic encoder 310 | EA2 |
| APPS_GOOD | Integer | 1 | Numeric distribution encoder 308 | EA3 |
| FIRST_SEEN | Datetime | 2019 Jan. 1 | Not Available | |
| RGT_CITY | String | Singapore | Value-format encoder 311 | EA4 |
| | | | Semantic encoder 310 | EA5 |

Further, in various embodiments, one or more of the sub-modules is operable to generate encode values based on a particular characteristic of the data in a dataset or the structure of the dataset itself. For example, as described in more detail below, schema encoder 306 is operable to generate encode values that correspond to the structure of a dataset, and update pattern encoder 312 is operable to analyze an update pattern associated with data records in a dataset (e.g., using a historical version of the dataset). In the present example, the data encoder module 104 may generate various encode values 112 (such as encode values EA1-EA5, in the example above) and store these encode values 112 in encode value data store 106 for subsequent use in determining whether a new dataset 110 matches Dataset A. The operation of each of the depicted sub-modules of data encoder module 104, according to some embodiments, is described in more detail below.

In the depicted embodiment, data encoder module 104 includes schema encoder 306, numerical distribution encoder 308, semantic encoder 310, value-format encoder 311, and update pattern encoder 312. Note, however, that this embodiment is provided merely as one non-limiting example. In other embodiments, additional or fewer encoder sub-modules may be included in data encoder module 104, as desired. Schema encoder 306, in various embodiments, is operable to encode the properties of the schema of a dataset (e.g., existing datasets retrieved from the live data store 216, new dataset 110 received from the user, etc.) to generate corresponding "schema encode values." As a non-limiting example, these properties may include the number of data fields, the format of the data fields, metadata record hash codes, the number of data record keys, the update frequency, the data source, the creation time, the schema type, or any of various other suitable items of metadata corresponding to the schemas. Note, however, that, in various embodiments, the structure of the schema encode values may vary among different schema for different datasets in the plurality of datasets. In various embodiments, the information included in the schema encode values (also referred to as "schema encodes") may be used by matching dataset detection module 108 to compare the schema of a new dataset 110 against the schema of a previously analyzed dataset. For example, as described in more detail below with reference to FIG. 7, if the schema for the new dataset 110 does not match the schema for a previously analyzed dataset, the matching dataset detection module 108 may determine that the two datasets do not match and, as such, proceed to compare the encode values of the new dataset 110 to encode values for other previously analyzed datasets (if available).

Numerical distribution encoder 308, in various embodiments, is operable to generate encode values 112 that are usable by matching dataset detection module 108 to compare one or more value distributions associated with data in new dataset 110 to value distributions associated with data in previously analyzed datasets. For example, in some embodiments, numerical distribution encoder 308 is operable to generate "distribution encode values" corresponding to a distribution of numerical values included in a field of a dataset that has a numerical data type (e.g., where the numerical values in the field are stored using any suitable numerical data type, such as: short, int, long, float, double, etc.). Numerical distribution encoder 308, in various embodiments, is operable to calculate a latent probability distribution of the data values in one or more of the datasets retrieved from live data store 216. For example, in some embodiments, numerical distribution encoder 308 is operable to calculate the latent probability distribution of a dataset across multiple data record keys and across a temporal distribution of a historical version of the dataset. A "historical version" of a dataset may include multiple values for each data record (or a significant number of the data records in the dataset) in the dataset, indicating the value of the data records at different points in time over a particular retention time period. Stated differently, in some embodiments, the system 200 (e.g., live data store 216, experimental data store 218, etc.) may store "time-series" datasets in which, for each data record key, the time-series dataset includes a full history of the data record's values across different points in time. Further, as will be appreciated by one of skill in the art with the benefit of this disclosure, the term "latent probability distribution" refers to the probability distribution of latent variables that are estimated based on observed variables, rather than through direct observation. In some embodiments, the numerical distribution encoder 308 is operable to generate distribution encode values that include one or more latent probability distribution based on existing datasets retrieved, for example, from the live data store 216.

In various embodiments, the latent probability distribution(s) may be calculated using any of various suitable machine learning models, such as an autoencoder. As one non-limiting example, numerical distribution encoder 308 may generate one or more latent probability distributions based on the data retrieved from the live data store 216 using the Deep Autoencoding Gaussian Mixture Model (DAGMM). As will be appreciated by one of skill in the art with the benefit of this disclosure, the DAGMM consists of two major components: a compression network that projects samples into a low-dimensional space and an estimation network that infers latent variables and evaluates sample energy in the low-dimensional space under the Gaussian Mixture Modeling framework. In various embodiments, numerical distribution encoder 308 may be used to provide an end-to-end training framework for the DAGMM. Note, however, that this embodiment is listed as an example and is not intended to limit the scope of the disclosure. In various embodiments, the type of encoder used may vary depending on the type of data being encoded.

Semantic encoder 310, in various embodiments, is operable to generate encode values 112 that are usable by matching dataset detection module 108 to compare the semantic content of data in new dataset 110 to the semantic content of data in previously analyzed datasets. For example, in some embodiments, semantic encoder 310 is operable to use one or more natural language processing (NLP) language models to calculate vector word-embedding representations of data values in a field of the datasets (e.g., existing datasets retrieved from the live data store 216, new dataset 110, etc.) that contains string-type data. As will be appreciated by one of skill in the art with the benefit of this disclosure, "word-embedding" refers to the process of representing a word or phrase using a vector of numerical values, providing a numerical representation of the word or phrase. Stated differently, word-embedding is a process by which the semantic or syntactic use of words or phrases are encoded based on their usage in a corpus of data. In some embodiments, the semantic encode values generated by semantic encoder 310 may include these vector word-embedding representations (e.g., in which each word is represented as an N-dimensional vector, where N may vary according to different embodiments) and trained NLP language model(s), which may be used by matching dataset detection module 108 to compare the semantic content of data in new dataset 110 to the semantic content of data in previously analyzed datasets. In various embodiments, the NLP models used by semantic encoder 310 to generate the word-embedding values may be trained using any of various suitable libraries or models, such as fastText library (created by the Facebook™ AI Research ("FAIR") lab), the Word2vec model, or any other suitable technique.

Consider, for example, an "ADDRESS" field in new dataset 110 used to store address information using string-type data. In such an example, the matching dataset detection module 108 may generate one or more vector word-embedding representations of the data stored in this "ADDRESS" field and compare those one or more vector word-embedding representations to vector word-embedding representations for fields in previously analyzed datasets (e.g., as measured by Euclidean distance or through other suitable measures), which may enable the matching dataset detection module 108 to determine whether a particular field in a previously analyzed dataset is also used to store address information. Note that, in addition to various multi-dimensional vector comparison techniques, various other suitable techniques may be used to contribute to the semantic classification of the data values in a dataset. For example, in some embodiments, topic modeling techniques (such as latent Dirichlet allocation) or nearest neighbor/most-similar search techniques may also be used to compare semantic encode values for new dataset 110 and existing datasets.

Value-format encoder 311, in various embodiments, is operable to generate encode values 112 that are usable by matching dataset detection module 108 to compare a format of string-type data in new dataset 110 to the format of string-type data in one or more fields of one or more previously analyzed datasets. Note that, as used herein, the term "string-type data" is used broadly to refer to data that includes an ordered plurality of characters. In some embodiments, string-type data may be specified using a string data type. In other embodiments, however, string-type data may be specified using one or more other data types (e.g., an array). Further, in some embodiments, string-type data may be specified using an object, such as an instance of the String class in the Java™ programming language. In some embodiments, value-format encoder 311 is operable to automatically synthesize regular expressions, based on data from a dataset (e.g., datasets retrieved from live data store 216, new dataset 110, etc.) without external guidance. In some such embodiments, value-format encoder 311 is operable to utilize an algorithm, based on genetic programming, which is an evolutionary computation paradigm that implements a heuristic search in a space of candidate solutions. According to some such embodiments, the algorithm executes a search driven by a multi-objective optimization strategy aimed at simultaneously improving multiple performance indexes of candidate solutions. Techniques that may be used to generate regular expressions based on genetic programming, according to some embodiments, are described in more detail in "Inference of Regular Expressions for Text Extraction from Examples" by A. Bartoli, A. De Lorenzo, E. Medvet and F. Tarlao, available in *IEEE Transactions on Knowledge and Data Engineering*, vol. 28, no. 5, pp. 1217-1230, 1 May 2016. In various embodiments, value-format encoder 311 is operable to provide a training service for these genetic models (e.g., one model for each variable). In various embodiments, the regular expression construction process is performed automatically using genetic programming algorithms on sampled data records from the datasets retrieved from live data store 216 or the new dataset 110. In some such embodiments, the encode values 112 generated by value-format encoder 311 are the automatically generated regular expressions, which, as described in more detail below, may be used to compare string-type data from a field in the dataset 110 to string-type data in one or more fields of one or more previously analyzed datasets. Note that the specific techniques described above are provided merely as examples and are not intended to limit the scope of the present disclosure.

Update pattern encoder 312, in various embodiments, is operable to generate encode values 112 that are usable by matching dataset detection module 108 to compare an update pattern associated with data records in new dataset 110 to an update pattern associated with data records in one or more previously analyzed datasets. For example, in some embodiments, new dataset 110 is an updated version of an existing dataset maintained by (or accessible to) the system 200 in which the data monitoring system 102 is implemented. For example, as noted above, live data store 216, in various embodiments, may maintain historical versions of one or more datasets. In instances in which new dataset 110 is an updated version of a historical dataset maintained by system 200 (e.g., at live data store 216), it may be desirable to validate the manner in which the data in dataset 110 is being updated with reference to previous versions of the same dataset. In various embodiments, update pattern encoder 312 is operable to generate update pattern encode values corresponding to the temporal dimension of the data records in the historical dataset for use by matching dataset detection module 108 to determine whether the new dataset 110 matches any of the previously analyzed datasets (e.g., the dataset of which new dataset 110 is an updated version).

Figure 4:
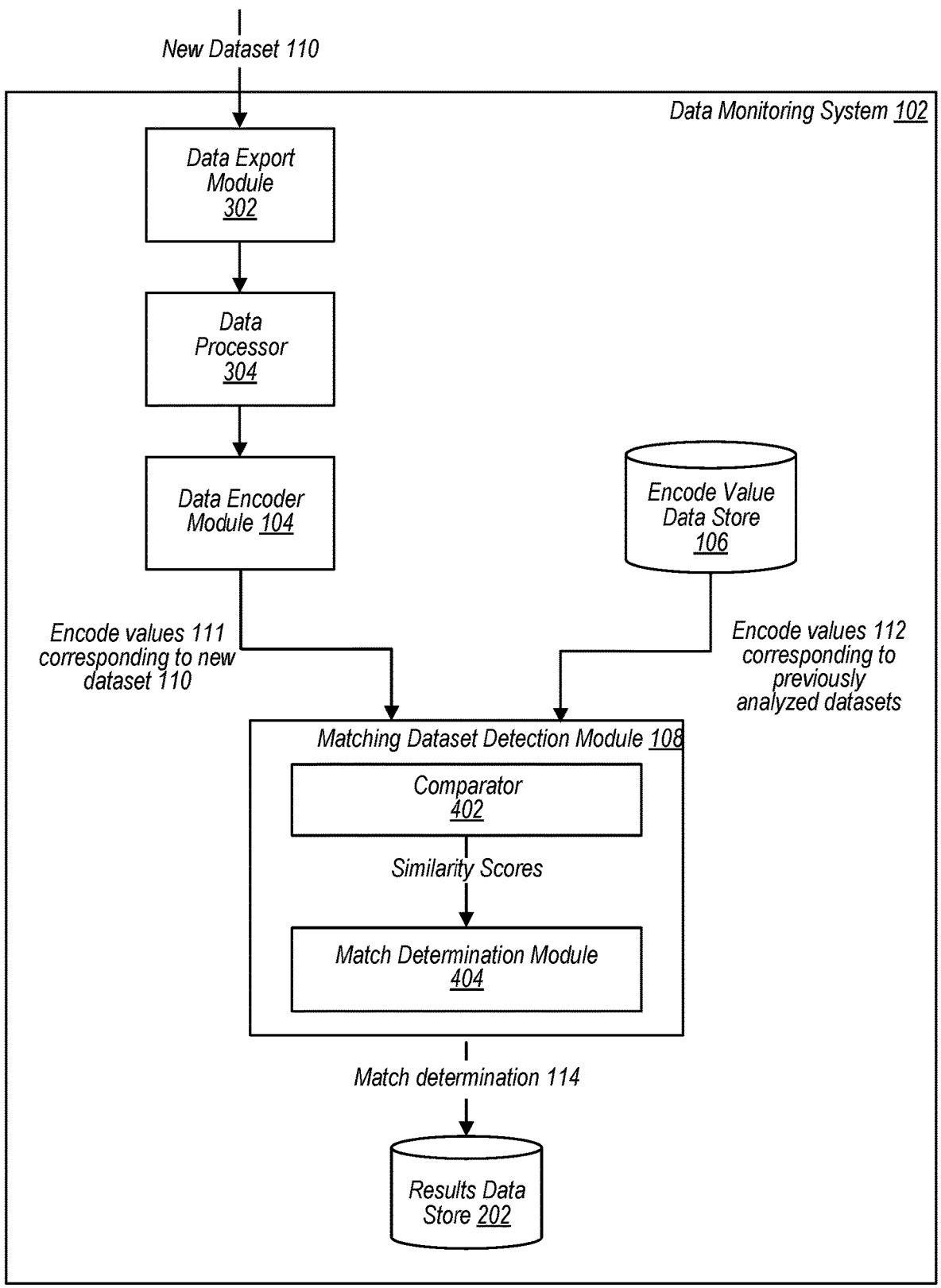
FIG. 4 is a block diagram illustrating an example data monitoring system and matching dataset detection module, according to some embodiments.

FIG. 4 depicts a block diagram with a more detailed view of data monitoring system 102 and matching dataset detection module 108, according to some embodiments. As described in more detail below, matching dataset detection module 108 is operable to determine whether a new dataset 110 matches a previously analyzed dataset using encode values generated based on fields within the respective datasets, according to various embodiments. Consider, for example, an embodiment in which a data scientist wants to create a new dataset, Dataset B, which is structured as follows:

| Id | Field Name | Field Data Type |
|----|------------|-----------------|
| 1  | EMAIL      | String          |
| 2  | APPS_GOOD  | Integer         |
| 3  | APPS_BAD   | Integer         |
| 4  | FIRST_SEEN | Datetime        |
| 5  | LAST_SEEN  | Datetime        |
| 6  | RGT_CITY   | String          |

In this non-limiting example, each field of Dataset B includes an id number, field name, and field data type. Table 3, below, shows an example data record with an example data value for each of the fields of Dataset B:

| EMAIL | APPS_GOOD | APPS_BAD | FIRST_SEEN | LAST_SEEN | RGT_CITY |
|-------|-----------|----------|------------|-----------|----------|
| name@example.com | 1 | 0 | 2019 Jun. 12 | 2019 Aug. 15 | Paris |

In this example, assume that the data scientist is unaware of the existence of Dataset A (shown above) and wishes to use the data monitoring system 102 to determine whether the new dataset, Dataset B, matches any of the previously analyzed datasets included in (or accessible to) the system. In various embodiments, data monitoring system 102 and matching dataset detection module 108 are operable to compare encode values 111, corresponding to Dataset B, to encode values 112 corresponding to previously analyzed datasets to determine whether Dataset B matches any of the previously analyzed datasets.

In FIG. 4, data monitoring system 102 includes data export module 302, which is operable to retrieve new dataset 110 (e.g., from a location within system 200 of FIG. 2, such as experimental data store 218 at non-production datacenter 214), according to some embodiments. For example, in various embodiments, data export module 302 is operable to export new dataset 110 (or a portion thereof) from experimental data store 218. In various embodiments, data export module 302 may operate in a batch mode (retrieving datasets 110 at predetermined time intervals) or in a streaming mode (retrieving new datasets 110 at or near the time that they are added to the experimental data store 218). Note, however, that the depicted embodiment is provided merely as one non-limiting example. In some embodiments, a user may provide the new dataset 110 to the data monitoring system 102 directly and, in such embodiments, the data export module 302 may be bypassed. Data monitoring system 102, in the embodiment of FIG. 4, further includes data processor 304. In various embodiments, data processor 304 is operable to process the data in new dataset 110 and convert it into one or more formats for input into the various sub-modules of data encoder module 104. Non-limiting examples of the operations that may be performed by the data processor 304 include: cleaning empty data records, removing non-supported data type columns, removing quasi-numerical variables, etc.

Data monitoring system 102 further includes data encoder module 104, which, as described above, is operable to generate one or more encode values 111 based on the new dataset 110. Continuing with the example above, data encoder module 104 may generate various encode values 111 for Dataset B, as shown below in Table 4:

TABLE 4

| Field Name | Field Data Type | Example | Encoder Module Used | Example Encode Name |
|---|---|---|---|---|
| EMAIL | String | name@example.com | Value-format encoder 311 | EB1 |
| | | | Semantic encoder 310 | EB2 |
| APPS_GOOD | Integer | 1 | Numeric distribution encoder 308 | EB3 |
| APPS_BAD | Integer | 0 | Numeric distribution encoder 308 | EB4 |
| FIRS_SEEN | Datetime | 2019 Jun. 12 | Not Available | — |
| LAST_SEEN | Datetime | 2019 Aug. 15 | Not available | — |
| RGT_CITY | String | Paris | Value-format encoder 311 | EB5 |
| | | | Semantic encoder 310 | EB6 |

Thus, in this non-limiting example, value-format encoder 311 and semantic encoder 310 may generate encode values for the "EMAIL" and "RGT_CITY" fields and numerical distribution encoder 308 may generate encode values for the "APPS_GOOD" and "APPS_BAD" fields. Note that, in this depicted embodiment, no encode values are generated based on the "FIRST_SEEN" or "LAST_SEEN" fields of Dataset B. Further, note that data encoder module 104 may further generate a schema encode value (e.g., using schema encoder 306) and an update pattern encode value (e.g., using update pattern encoder 312) for Dataset B, in various embodiments. Note, however, that this embodiment is depicted merely as one non-limiting example and, in other embodiments, additional, fewer, or different encode values may be generated by data encoder module 104 for a new dataset 110.

In FIG. 4, data monitoring system 102 further includes matching dataset detection module 108, which, in various embodiments, is operable to determine whether a new dataset 110 matches a previously analyzed dataset by comparing the encode values 111 for the new dataset 110 to the encode values 112 for the previously analyzed datasets. For example, data monitoring system 102 includes (or has access to) encode value data store 106 and is operable to retrieve encode values 112 corresponding to various previously analyzed datasets for comparison to encode values 111 corresponding to a new dataset 110. For example, matching dataset detection module 108 may retrieve encode values 112 corresponding to various previously analyzed datasets, such as example Dataset A described above with reference to FIG. 3, for comparison to encode values 111 corresponding to example Dataset B.

Matching dataset detection module 108 includes comparator 402, which is operable to compare encode values using any of various suitable comparison algorithms or techniques. In some embodiments, for example, comparator 402 compares encode values using the Kullback-Leibler divergence. Note, however, that this embodiment is provided merely as one non-limiting example. In other embodiments, any suitable comparison algorithm or technique may be used, such as cross-entropy, Wasserstein distance, Jensen-Shannon divergence, etc. Further, note that, in some embodiments, comparator 402 may utilize multiple different comparison algorithms or techniques when comparing a pair of encode values or may utilize different comparison algorithms or techniques when comparing different types of encode values (e.g., a first comparison algorithm for comparing numerical distribution encode values and a second comparison algorithm for comparing semantic encode values).

In various embodiments, comparator 402 compares encode values that were generated by the same (or same type) of encoder sub-module. For example, when comparing the encode values 111 for Dataset B to the encode values 112 for Dataset A, comparator 402 may compare: encode value EB1 to encode values EA1 and EA4, encode value EB2 to encode values EA2 and EA5, encode value EB3 to encode value EA3, and so on until it has compared all of the encode values 111 for Dataset B to corresponding encode values 112 (e.g., encode values generated using the same type of encoder sub-module) for Dataset A. That is, in various embodiments, comparator 402 is operable to compare each of the encode values 111 for a new dataset 110 to any corresponding encode values 112 (if available) for the previously analyzed dataset against which the new dataset 110 is being compared. Comparator 402, in various embodiments, is operable to generate output values based on the comparison of the encode values for the datasets under comparison. For example, for each of the comparisons, comparator 402 may generate an output value (also referred to as a "similarity score") that indicates a similarity between the two encode values being compared. The format of the similarity scores may vary depending on the particular comparison algorithm(s) used by comparator 402. In the depicted embodiment, assume that comparator 402 generates similarity scores in the range of 0.0-1.0, with a higher value indicating a higher degree of similarity between the two encode values (e.g., such that an exact match would be denoted by a similarity score of 1.0).

Matching dataset detection module 108 further includes match determination module 404, which, in various embodiments, is operable to determine whether a new dataset 110 matches a previously analyzed dataset based on the similarity score(s) generated by comparator 402. As noted above, in various embodiments, match determination module 404 may determine whether two datasets "match" by determining whether the similarity score(s) for those two datasets satisfy a "similarity criterion," which may vary according to different embodiments. For example, when comparing a given pair of encode values, match determination module 404 may determine whether the similarity score exceeds a particular threshold value. With reference to the comparison of the encode values for Datasets A and B, for example, assume that the threshold value is 0.8, and that the similarity score when comparing EB1 to EA1 is 0.9, and that the similarity score when comparing EB2 to EA2 is 0.85. In this non-limiting example, both of these similarity scores exceed their respective threshold values. Note that, in various embodiments, the particular threshold value may vary depending on the comparison algorithm(s) used by the comparator 402. Further note that, in some embodiments, match determination module 404 may utilize different threshold values for similarity scores based on different encode values (e.g., a first threshold value for similarity scores corresponding to numerical distribution encode values, a second threshold value for similarity scores corresponding to semantic encode values, etc.).

In various embodiments, the match determination module 404 may analyze the similarity score(s) generated by comparator 402 to determine whether the similarity score(s), for the two datasets under comparison, satisfy a similarity criterion and, accordingly, the two datasets "match." The number of similarity scores that must exceed their respective threshold values in order to satisfy the similarity criterion may vary, according to various embodiments. For example, in some such embodiments, the similarity scores may satisfy the similarity criterion if a single one of the similarity scores exceeds a particular threshold value. In other embodiments, the similarity scores may satisfy the similarity criterion if two, three, four, etc. similarity scores, or a certain percentage of the similarity scores for two datasets under comparison, exceed their respective threshold values. Further, note that, in some embodiments, the number or percentage of similarity scores that must exceed their respective threshold values in order to satisfy a similarity criterion may be provided by a user of the system that is trying to determine whether a new dataset 110 matches any of the previously analyzed datasets. Such embodiments may be particularly helpful in allowing the user to customize the requirements for a similarity criterion as he or she deems appropriate for a particular new dataset 110. In various embodiments, matching dataset detection module 108 is operable to generate a match determination 114 (e.g., provided as a Boolean value, a numerical value, or in any other suitable format) indicating whether the new dataset 110 matches the previously analyzed dataset against which it is being compared, and may store this match determination 114 in results data store 202, as described above.

In various embodiments, matching dataset detection module 108 may stop comparing the encode values 111 of new dataset 110 once it has detected a first match with a previously analyzed dataset. In other embodiments, however, matching dataset detection module 108 may continue comparing the encode values until it has compared the encode values 111 of new dataset 110 to the encode values 112 of all of the previously analyzed datasets, a particular percentage (e.g., 50%, 66%, 75%, etc.) of the previously analyzed datasets, until a particular number of matches (e.g., 2, 5, 10, etc.) have been found, etc.

Example Methods

Referring now to FIG. 5, a flow diagram depicts an example method 500 for determining whether a new dataset matches one or more previously analyzed datasets using encode values, according to some embodiments. In various embodiments, method 500 may be performed by data monitoring system 102 of FIG. 2. For example, data monitoring system 102 may include (or have access to) a non-transitory, computer-readable medium having program instructions stored thereon that are executable by one or more computer systems in the data monitoring system 102 to cause the operations described with reference to FIG. 5. In FIG. 5, method 500 includes elements 502-514. Although these elements are shown in a particular order for ease of understanding, other orders may be used. In various embodiments, some of the method elements may be performed concurrently, in a different order than shown, or may be omitted. Additional method elements may also be performed as desired.

At 502, in the illustrated embodiment, the data monitoring system 102 performs encoding operations on a first dataset to generate a first encode value, where the first dataset includes a first plurality of fields, and where the first encode value corresponds to a particular one of the first plurality of fields. For example, data monitoring system 102 may receive a new dataset 110 and data encoder module 104 may generate one or more encode values 111 based on one or more fields included in the new dataset 110. In some embodiments, performing the encoding operations for the particular field includes selecting a particular one of a plurality of encoder modules (e.g., encoder modules 306-312 of FIG. 3) based on a data type associated with the particular field, and encoding data included in the particular field of the first dataset, using the particular encoder module, to generate the first encode value. In instances in which the particular field of the first dataset includes string-type data, encoding the data in the particular field may include generating one or more word-embedding representations of the string-type data included in the particular field of the first dataset. Further, in instances in which the particular field of the first dataset includes string-type data, encoding the data in the particular field may include generating a first regular expression based on the string-type data included in the particular field of the first dataset. In instances in which the particular field includes numerical data, encoding the data included in the particular field may include calculating a first latent probability distribution corresponding to the numerical data in the particular field of the first dataset.

At 504, in the illustrated embodiment, data monitoring system 102 determines whether the first dataset matches a previously analyzed dataset, where the previously analyzed dataset includes a second plurality of fields. In various embodiments, data monitoring system 102 determines whether the new dataset 110 matches any of the previously analyzed dataset by comparing their respective encode values, which is described in more detail below with reference to FIGS. 6 and 7. In the depicted embodiment, element 504 includes sub-elements 506-510. At 506, in the illustrated embodiment, data monitoring system 102 compares the first encode value to a previous encode value that corresponds to a second field, of the second plurality of fields, of the previously analyzed dataset. For example, in some embodiments, the second field of the previously analyzed dataset has the same data type as the data type associated with the particular field of the first dataset. In such embodiments, method 500 may include retrieving the previous encode value, which was generated by encoding data included in the second field of the previously analyzed dataset using the particular encoder module. In embodiments in which the first encode value is a first regular expression, element 506 may include retrieving, as the previous encode value, a second regular expression generated based on string-type data included in the second field of the previously analyzed dataset and comparing the first and second regular expressions. Further, in embodiments in which the first encode value is a first latent probability distribution, element 506 may include retrieving, as the previous encode value, a second latent probability distribution corresponding to numerical data included in the second field of the previously analyzed dataset and comparing the first and second latent probability distributions.

At 508, in the illustrated embodiment, data monitoring system 102 generates an output value, based on the comparison performed in element 506, that is indicative of a similarity between the first encode value and the previous encode value. As noted above, in some embodiments, this output value (also referred to herein as a "similarity score") may be specified using the Kullback-Leibler divergence.

At 510, in the illustrated embodiment, data monitoring system 102 determines, based on the output value, whether the first dataset matches the previously analyzed dataset. For example, as described above with reference to FIG. 4, match determination module 404 is operable to determine, based on one or more similarity scores corresponding to the comparison of one or more pairs of encode values, whether the new dataset 110 matches a particular previously analyzed dataset. In some embodiments, this determination may be made on the basis of a single similarity score. In other embodiments, however, match determination module 404 is operable to make this determination based on two or more similarity scores. Note that, in some embodiments, method 500 may further include, prior to determining whether the first dataset matches the previously analyzed dataset, generating encode values for one or more of the second plurality of fields included in the previously analyzed dataset, as described above with reference to FIG. 3. Further, as noted above, in some embodiments it may be advantageous to compare the schema of two datasets prior to comparing one or more other encode values of the datasets. In some such embodiments, method 500 further includes, prior to determining whether the first dataset matches the previously analyzed dataset, data monitoring system 102 comparing a first schema (e.g., one or more schema encode values) associated with the first dataset to a second schema associated with the previously analyzed dataset and, in response to a determination that the first schema does not match the second schema, determining that the first dataset does not match the previously analyzed dataset.

Figure 6:
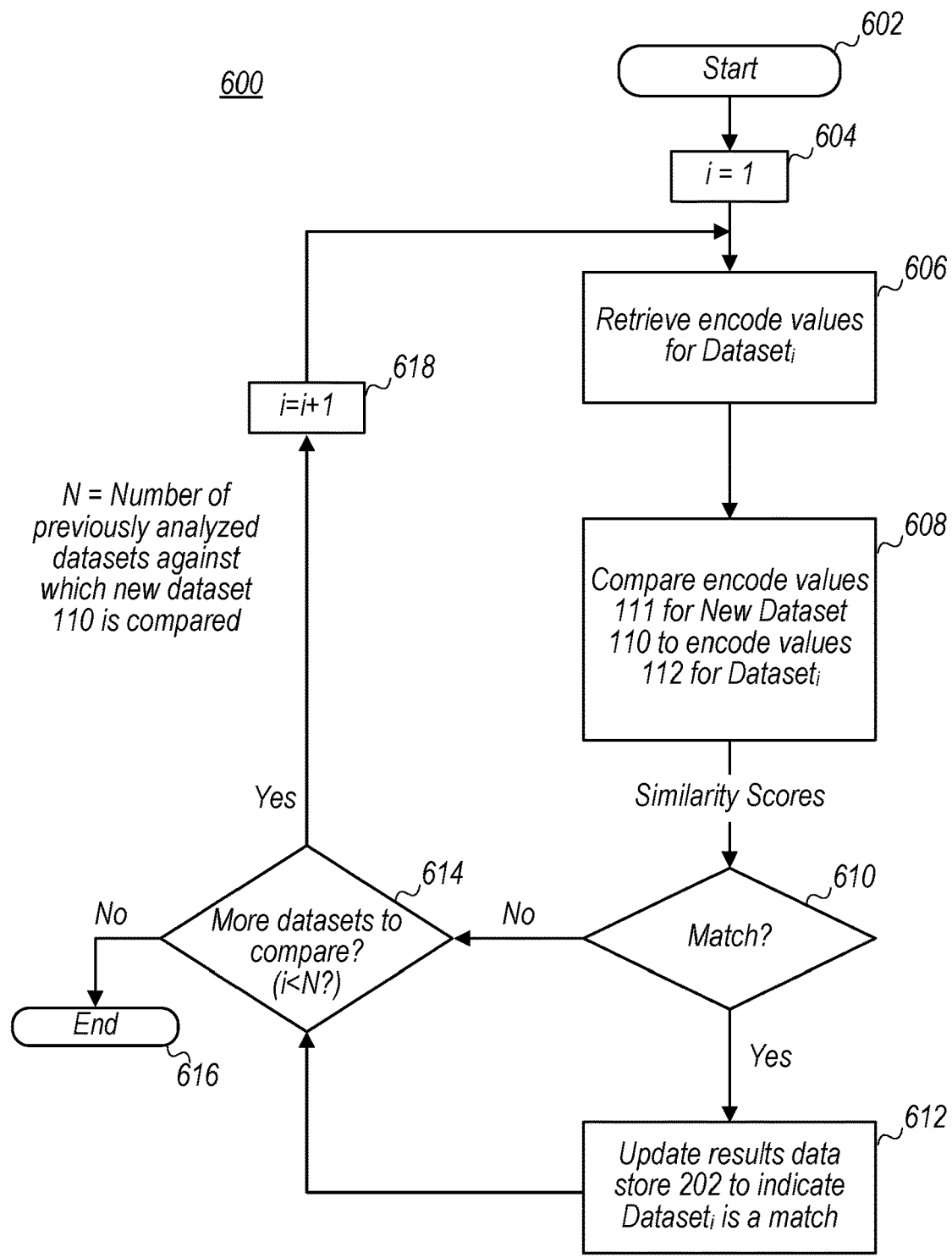

Turning now to FIG. 6, a flow diagram depicts an example method 600 for determining whether a new dataset matches one or more previously analyzed datasets using encode values, according to some embodiments. In various embodiments, method 600 may be performed by matching dataset detection module 108 of FIG. 1. For example, data monitoring system 102 may include (or have access to) a non-transitory, computer-readable medium having program instructions stored thereon that are executable by one or more computer systems in the data monitoring system 102 to cause the operations described with reference to FIG. 6. In FIG. 6, method 600 includes elements 602-618. Although these elements are shown in a particular order for ease of understanding, other orders may be used. In various embodiments, some of the method elements may be performed concurrently, in a different order than shown, or may be omitted. Additional method elements may also be performed as desired.

Method 600, in various embodiments, may be used to determine whether a new dataset 110 (e.g., example Dataset B, above) matches any of the previously analyzed datasets (e.g., example Dataset A, above) using encode values generated based on the respective datasets. For example, method 600 proceeds from its start at 602 to element 604, where a counter variable "i" is initialized with a value of "1." Method 600 then proceeds to element 606, where matching dataset detection module 108 retrieves (e.g., from encode value data store 106) one or more encode values 112 corresponding to a previously analyzed dataset (e.g., Dataset A). As explained in more detail below, in the depicted embodiment, matching dataset detection module 108 is operable to compare the encode values 111 of new dataset 110 to one or more of the encode values 112 for each of the previously analyzed datasets. Further, in the depicted embodiment, matching dataset detection module 108 compares new dataset 110 to one previously analyzed dataset at a time, iterating through the previously analyzed datasets until the encode values 111 for the new dataset 110 have been compared to the encode values 112 of each of the previously analyzed datasets. That is, in the depicted embodiment, the matching dataset detection module 108 retrieves the encode values 112 for a first previously analyzed dataset, performs the comparison between the encode values 111 and 112, generates a match determination 114, and then proceeds to analyze the next previously analyzed dataset. Note, however, that this embodiment is provided merely as one non-limiting example. In other embodiments, the matching dataset detection module 108 may compare the encode values 111 for new dataset 110 to the encode values 112 of any suitable subset of the previously analyzed datasets (e.g., until a match is detected), as desired.

At 608, in the illustrated embodiment, matching dataset detection module 108 compares the encode values 111 for the new dataset 110 to the encode values 112 for a first previously analyzed dataset. The process of comparing encode values 111 for the new dataset to the encode values 112 for a previously analyzed dataset, according to some embodiments, is described in more detail below with reference to FIG. 7. As shown in FIG. 6, matching dataset detection module 108, in various embodiments, is operable to generate one or more similarity scores that indicate a similarity between two encode values being compared. As described in more detail below, matching dataset detection module 108 may compare each of the encode values 111 to any corresponding encode values 112 for the first previously analyzed dataset, generating a similarity score for each comparison. At 610, in the illustrated embodiment, matching dataset detection module 108 determines whether the new dataset 110 and the first previously analyzed dataset are a match based on these similarity scores, as described above with reference to FIG. 4. If the two datasets are not a match, method 600 proceeds to element 614. If the datasets are a match, however, method 600 proceeds to element 612, where matching dataset detection module 108 updates the results data store 202 to indicate that the first previously analyzed dataset is a match for new dataset 110. (Note that, in some embodiments, the matching dataset detection module 108 may generate and store a match determination 114 for the first previously analyzed dataset whether it matches new dataset 110 or not.)

Method 600 then proceeds to element 614, where matching dataset detection module 108 determines whether there are any more previously analyzed datasets to compare to the new dataset 110. In the non-limiting example of FIG. 6, this determination is made by comparing the value of the counter variable i to "N," the number of previously analyzed datasets against which the new dataset 110 is being compared. If, in this example embodiment, there are not any more datasets to compare, method 600 ends at 616. If, however, there are additional datasets against which to compare new dataset 110, method 600 proceeds to element 618, incrementing the counter variable i, and then proceeds to repeat elements 606-614.

Figure 7:
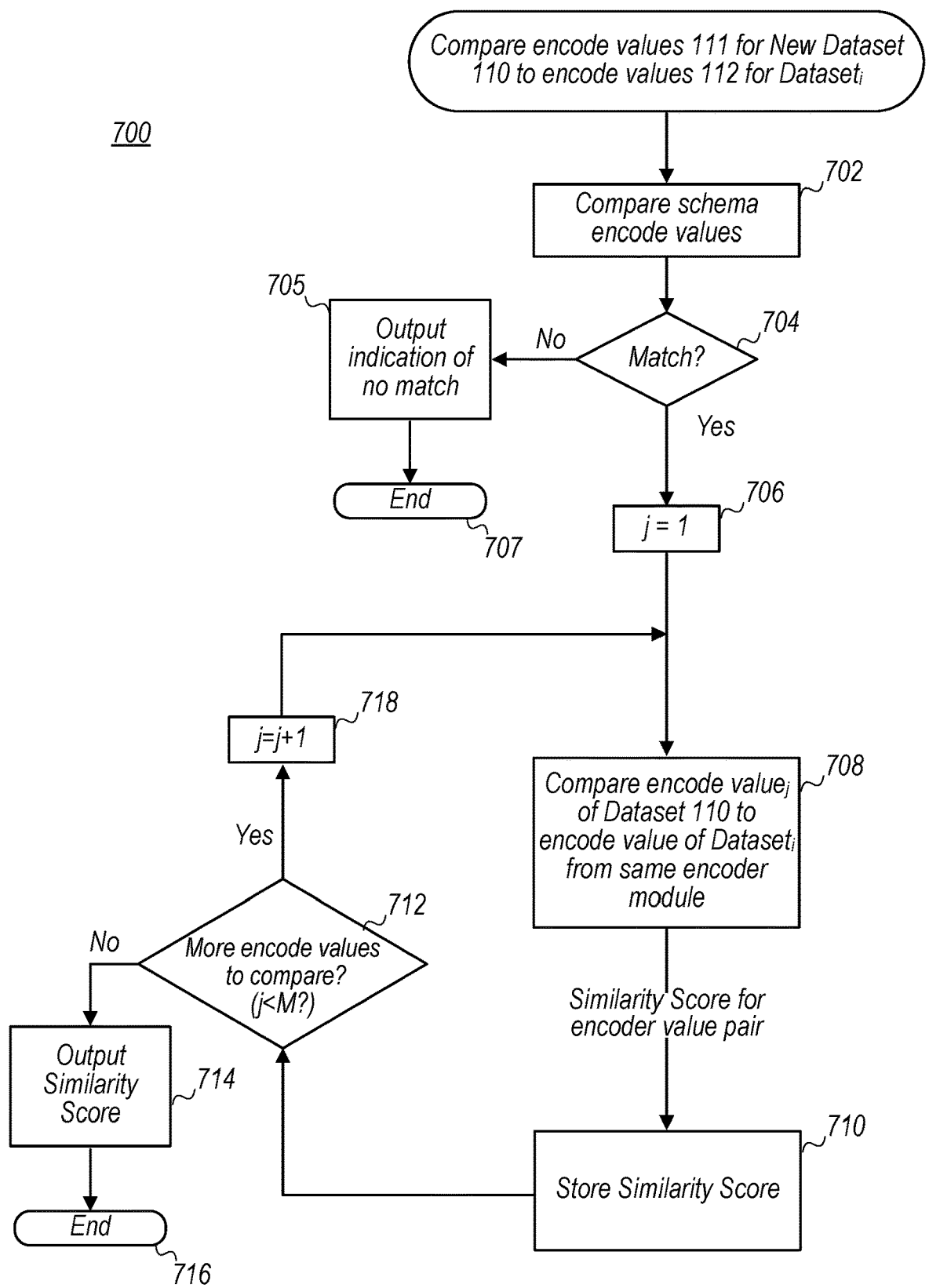
FIG. 7 is a flow diagram illustrating an example method for comparing encode values for new dataset to encode values for a previously analyzed dataset, according to some embodiments.

In FIG. 7, a flow diagram illustrating an example method 700 for comparing encode values 111 for new dataset 110 to encode values 112 for a previously analyzed dataset, according to some embodiments. In some embodiments, method 700 may be performed to implement element 608 of FIG. 6. In various embodiments, method 700 may be performed by matching dataset detection module 108 of FIG. 1. For example, data monitoring system 102 may include (or have access to) a non-transitory, computer-readable medium having program instructions stored thereon that are executable by one or more computer systems in the data monitoring system 102 to cause the operations described with reference to FIG. 7. In FIG. 7, method 700 includes elements 702-718. Although these elements are shown in a particular order for ease of understanding, other orders may be used. In various embodiments, some of the method elements may be performed concurrently, in a different order than shown, or may be omitted. Additional method elements may also be performed as desired.

At 702, in the illustrated embodiment, matching dataset detection module 108 compares schema encode values for new dataset 110 to schema encode values for the previously analyzed dataset. As noted above, when comparing encode values 111 for new dataset 110 to encode values 112 for a previously analyzed dataset, matching dataset detection module 108 may first compare the schema encode values because, in some embodiments, if the schema encode values for the two datasets do not match, the previously analyzed dataset may be ruled out as a potential match for the new dataset 110. That is, in some embodiments, if the schema encode values for the new dataset 110 and the previously analyzed dataset do not match, the matching dataset detection module 108 may determine that the previously analyzed dataset is not a match without having to compare any other encode values. If, at 704, the schema encode values do not match, method 700 proceeds to 705, where the matching dataset detection module 108 generates an output indicating that the two datasets do not match (e.g., by generating a similarity score indicating that the datasets are not sufficiently similar to be considered a match, by generating some predetermined value indicating that the datasets do not match, etc.) and the method 700 ends at 707. If, however, the schema encode values do match at 704, method 700 proceeds to elements 706-712 for further comparison of the encode values.

As one non-limiting example of the comparison of schema encode values in elements 702 and 704, consider the following schema encode values for three datasets (Datasets A, B, and C) provided below in Table 5:

TABLE 5

| Dataset | Schema encode | Need compare field encoders with B? |
|---------|---------------|-------------------------------------|
| A | {num_fields: 4, num_keys: 1, frequency: weekly, source: fast-r, creation_time: 20180301000000, type: radd} | Yes |
| B | {num_fields: 6, num_keys: 1, frequency: weekly, source: fast-r, creation_time: 20180301000000, type: radd} | |
| C | {num_fields: 6, num_keys: 1, frequency: weekly, source: idi, creation_time: 20180301000000, type: edge} | No |

When comparing the schema encode values of Dataset B (e.g., the new dataset 110) to the schema encode values of Dataset A (e.g., the previously analyzed dataset), matching dataset detection module 108 may determine that the schema encode values match at 704 and, as such, proceed to element 706. When comparing the schema encode values of Dataset B to the schema encode values of Dataset C (e.g., the previously analyzed dataset for a different iteration of method 700), matching dataset detection module 108 may determine that the "source" and "type" of encode values differ between Datasets B and C and, as such, determine that the schema encode values of the two datasets do not match at 704. Method 700 may then end, for the particular previously analyzed dataset under comparison, at 707.

At 706, in the depicted embodiment, a counter variable "j" is initialized with a value of "1." In the depicted embodiment, method 700 iteratively compares each of the encode values 111 for the new dataset to any corresponding encode values 112 (if available) for the previously analyzed dataset. As a non-limiting example, matching dataset detection module 108 compares each value-format encode value in encode values 111 to all of the value-format encode values (if any) for the previously analyzed dataset, each numerical distribution encode value in encode values 111 to all of the numerical distribution encode values (if any) for the previously analyzed dataset, etc. In FIG. 7, this iterative process is depicted in elements 708-718. For example, at 708, matching dataset detection module 108 compares an encode value 111 at index "j" to a corresponding encode value 112 of the previously analyzed dataset to generate a similarity score for the encoder value pair, stores this similarity score at 710, and then, at 712, determines whether there are any more encode values to compare for the new dataset 110 and the previously analyzed dataset. In the non-limiting example of FIG. 7, this determination is made by comparing the value of the counter variable j to "M," the number of encode value pairs to compare for the new dataset 110 and the previously analyzed dataset. In some such embodiments, "M" may be greater than the number of encode values 111 for the new dataset 110 (if there are multiple of the same type of encode value to compare) or less than the number of encode values 111 (if there is not a corresponding encode value 112 for one or more of the encode values 111). Note, however, that this example is provided merely as one non-limiting example. If there are additional encode values to compare, method 700 proceeds to element 718, incrementing the counter variable j, and then proceeds to repeat elements 708-712. If, however, there are not any additional encode values to compare, method 700 proceeds to element 714, where the similarity score(s) for the new dataset 110 and the previously analyzed dataset are output (e.g., to match determination module 404) and the method 700 ends at 716.

Example Computer System

Figure 8:
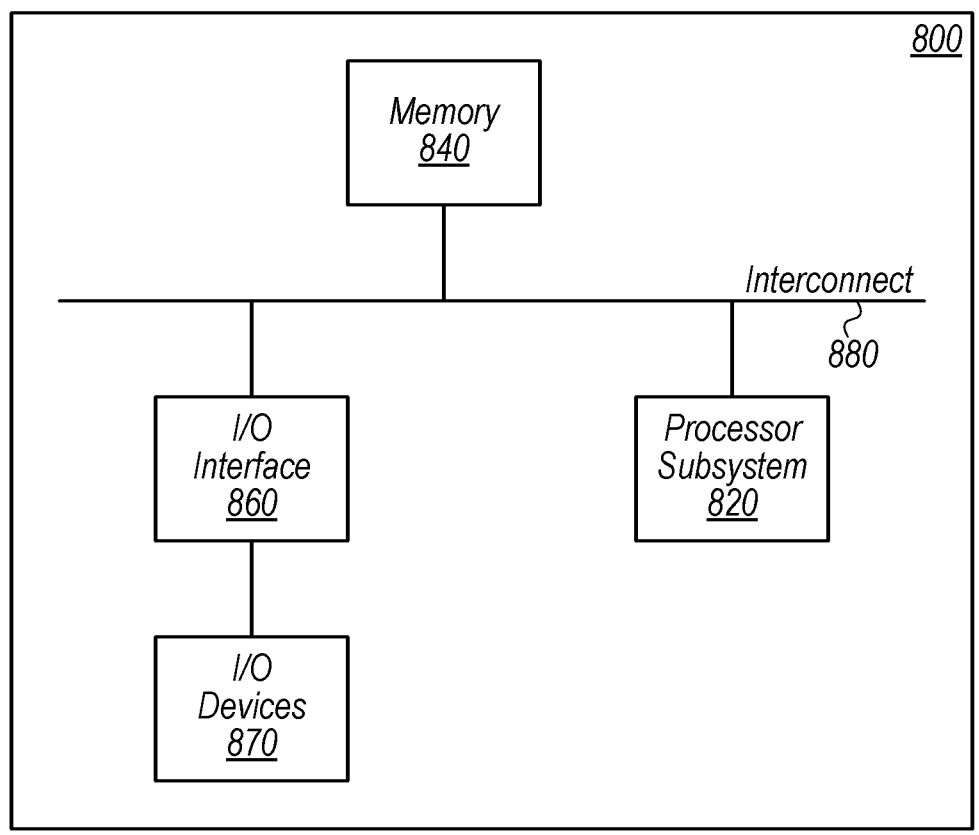
FIG. 8 is a block diagram illustrating an example computer system, according to some embodiments.

Referring now to FIG. 8, a block diagram of an example computer system 800 is depicted, which may implement one or more computer systems, such as data monitoring system 102, according to various embodiments. Computer system 800 includes a processor subsystem 820 that is coupled to a system memory 840 and I/O interfaces(s) 860 via an interconnect 880 (e.g., a system bus). I/O interface(s) 860 is coupled to one or more I/O devices 870. Computer system 800 may be any of various types of devices, including, but not limited to, a server computer system, personal computer system, desktop computer, laptop or notebook computer, mainframe computer system, server computer system operating in a datacenter facility, tablet computer, handheld computer, workstation, network computer, etc. Although a single computer system 800 is shown in FIG. 8 for convenience, computer system 800 may also be implemented as two or more computer systems operating together.

Processor subsystem 820 may include one or more processors or processing units. In various embodiments of computer system 800, multiple instances of processor subsystem 820 may be coupled to interconnect 880. In various embodiments, processor subsystem 820 (or each processor unit within 820) may contain a cache or other form of on-board memory.

System memory 840 is usable to store program instructions executable by processor subsystem 820 to cause system 800 perform various operations described herein. System memory 840 may be implemented using different physical, non-transitory memory media, such as hard disk storage, floppy disk storage, removable disk storage, flash memory, random access memory (RAM-SRAM, EDO RAM, SDRAM, DDR SDRAM, RAMBUS RAM, etc.), read only memory (PROM, EEPROM, etc.), and so on. Memory in computer system 800 is not limited to primary storage such as system memory 840. Rather, computer system 800 may also include other forms of storage such as cache memory in processor subsystem 820 and secondary storage on I/O devices 870 (e.g., a hard drive, storage array, etc.). In some embodiments, these other forms of storage may also store program instructions executable by processor subsystem 820.

I/O interfaces 860 may be any of various types of interfaces configured to couple to and communicate with other devices, according to various embodiments. In one embodiment, I/O interface 860 is a bridge chip (e.g., Southbridge) from a front-side to one or more back-side buses. I/O interfaces 860 may be coupled to one or more I/O devices 870 via one or more corresponding buses or other interfaces. Examples of I/O devices 870 include storage devices (hard drive, optical drive, removable flash drive, storage array, SAN, or their associated controller), network interface devices (e.g., to a local or wide-area network), or other devices (e.g., graphics, user interface devices, etc.). In one embodiment, I/O devices 870 includes a network interface device (e.g., configured to communicate over WiFi, Bluetooth, Ethernet, etc.), and computer system 800 is coupled to a network via the network interface device.

Although the embodiments disclosed herein are susceptible to various modifications and alternative forms, specific embodiments are shown by way of example in the figures and are described herein in detail. It should be understood, however, that figures and detailed description thereto are not intended to limit the scope of the claims to the particular forms disclosed. Instead, this application is intended to cover all modifications, equivalents and alternatives falling within the spirit and scope of the disclosure of the present application as defined by the appended claims. The headings used herein are for organizational purposes only and are not meant to be used to limit the scope of the description.

This disclosure includes references to "one embodiment," "a particular embodiment," "some embodiments," "various embodiments," "an embodiment," etc. The appearances of these or similar phrases do not necessarily refer to the same embodiment. Particular features, structures, or characteristics may be combined in any suitable manner consistent with this disclosure.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. As used herein, the term "or" is used as an inclusive or and not as an exclusive or. For example, the phrase "at least one of x, y, or z" means any one of x, y, and z, as well as any combination thereof (e.g., x and y, but not z).

It is to be understood that the present disclosure is not limited to particular devices or methods, which may, of course, vary. It is also to be understood that the terminology used herein is for the purpose of describing particular embodiments only and is not intended to be limiting. As used herein, the singular forms "a," "an," and "the" include singular and plural referents unless the context clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation A structure can be said to be "configured to" perform some task even if the structure is not currently being operated. A "memory device configured to store data" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

In this disclosure, various "modules" operable to perform designated functions are shown in the figures and described in detail above (e.g., data encoder module 104, matching dataset detection module 108, etc.). As used herein, the term "module" refers to circuitry configured to perform specified operations or to physical, non-transitory computer-readable media that stores information (e.g., program instructions) that instructs other circuitry (e.g., a processor) to perform specified operations. Such circuitry may be implemented in multiple ways, including as a hardware circuit or as a memory having program instructions stored therein that are executable by one or more processors to perform the operations. The hardware circuit may include, for example, custom very-large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices, or the like. A module may also be any suitable form of non-transitory computer-readable media storing program instructions executable to perform specified operations.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method, comprising:
performing, by a data monitoring system, encoding operations on a first dataset to generate a set of encode values including first and second encode values generated using different types of encoding, wherein the first dataset includes first data organized into a first plurality of fields, the first data includes data records having data values for multiple fields within the first plurality of fields, and the first encode value corresponds to a particular field of the first plurality of fields;
determining, by the data monitoring system, whether the first dataset matches a previously analyzed dataset, wherein the previously analyzed dataset includes second data organized into a second plurality of fields, the second data includes data records having data values for multiple fields within the second plurality of fields, and the determining includes:
comparing the set of encode values to a previous set of encode values, wherein the previous set of encode values includes third and fourth encode values generated using different types of encoding and the third encode value corresponds to a second field, of the second plurality of fields, of the previously analyzed dataset;
based on the comparing, generating an output value that is indicative of a similarity between the set of encode values and the previous set of encode values; and
based on the output value, determining whether the first dataset matches the previously analyzed dataset.

2. The method of claim 1, wherein, for the particular field, the performing the encoding operations includes:
selecting a particular one of a plurality of encoder modules based on a data type associated with the particular field; and
encoding data included in the particular field of the first dataset, using the particular encoder module, to generate the first encode value.

3. The method of claim 2, wherein the second field of the previously analyzed dataset has a same data type as the data type associated with the particular field of the first dataset; and
wherein the determining whether the first dataset matches the previously analyzed dataset further includes:
retrieving the third encode value corresponding to the second field of the previously analyzed dataset, wherein the third encode value was generated by encoding data included in the second field of the previously analyzed dataset using the particular encoder module.

4. The method of claim 2, wherein
the particular field of the first dataset includes string-type data;
a type of encoding used to generate the first encode value includes semantic encoding; and
the encoding data included in the particular field of the first dataset includes:
generating one or more vector word-embedding representations of the string-type data included in the particular field of the first dataset.

5. The method of claim 2, wherein
the particular field of the first dataset includes string-type data;
a type of encoding used to generate the first encode value includes value-format encoding; and
the encoding data included in the particular field of the first dataset includes:
generating a first regular expression based on the string-type data included in the particular field of the first dataset.

6. The method of claim 5, wherein the third encode value is a second regular expression generated based on string-type data included in the second field of the previously analyzed dataset; and
wherein the comparing the set of encode values to the previous set of encode values includes comparing the first and second regular expressions.

7. The method of claim 2, wherein
the particular field of the first dataset includes numerical data;

a type of encoding used to generate the first encode value includes numerical distribution encoding; and the encoding data included in the particular field of the first dataset includes:

calculating a first latent probability distribution corresponding to the numerical data in the particular field of the first dataset.

8. The method of claim 7, wherein the third encode value is a second latent probability distribution corresponding to numerical data included in the second field of the previously analyzed dataset; and wherein the comparing the set of encode values to the previous set of encode values includes comparing the first and second latent probability distributions.

9. The method of claim 1, further comprising:

prior to determining whether the first dataset matches the previously analyzed dataset, comparing, by the data monitoring system, properties of a first schema associated with the first dataset to properties of a second schema associated with the previously analyzed dataset, wherein properties of the first schema include characteristics of the data records or the first plurality of fields; and in response to a determination that the first schema does not match the second schema, determining that the first dataset does not match the previously analyzed dataset.

10. The method of claim 1, wherein the output value is specified using Kullback-Leibler divergence.

11. A non-transitory, computer-readable medium having instructions stored thereon that are executable by a data monitoring system to perform operations comprising:

performing encoding operations on a first dataset to generate a set of encode values including first and second encode values generated using different types of encoding, wherein the first dataset includes first data organized into a first plurality of fields, the first data includes data records having data values for multiple fields within the first plurality of fields, and the first encode value corresponds to a particular field of the first plurality of fields;

determining whether the first dataset matches a previously analyzed dataset, wherein the previously analyzed dataset includes second data organized into a second plurality of fields, the second data includes data records having data values for multiple fields within the second plurality of fields, and the determining includes:

comparing the set of encode values to a previous set of encode values, wherein the previous set of encode values includes third and fourth encode values generated using different types of encoding and the third encode value corresponds to a second field, of the second plurality of fields, of the previously analyzed dataset;

based on the comparing, generating an output value that is indicative of a similarity between the set of encode values and the previous set of encode values; and based on the output value, determining whether the first dataset matches the previously analyzed dataset.

12. The non-transitory, computer-readable medium of claim 11, wherein, for the particular field, the performing the encoding operations includes:

selecting a particular one of a plurality of encoder modules based on a data type associated with the particular field; and encoding data included in the particular field of the first dataset, using the particular encoder module, to generate the first encode value.

13. The non-transitory, computer-readable medium of claim 12, wherein the second field has a same data type as the data type associated with the particular field of the first dataset; and wherein the determining whether the first dataset matches the previously analyzed dataset further includes:

retrieving the third encode value corresponding to the second field of the previously analyzed dataset, wherein the third encode value was generated by encoding data included in the second field of the previously analyzed dataset using the particular encoder module.

14. The non-transitory, computer-readable medium of claim 12, wherein the particular field of the first dataset includes string-type data;

a type of encoding used to generate the first encode value includes semantic encoding or value-format encoding; and the encoding data included in the particular field of the first dataset includes:

generating one or more vector word-embedding representations of the string-type data included in the particular field of the first dataset; or generating a first regular expression based on the string-type data included in the particular field of the first dataset.

15. The non-transitory, computer-readable medium of claim 12, wherein the particular field of the first dataset includes numerical data;

a type of encoding used to generate the first encode value includes numerical distribution encoding; and the encoding data included in the particular field of the first dataset includes:

applying a trained autoencoder machine learning model to the numerical data in the particular field to calculate a first latent probability distribution corresponding to the particular field of the first dataset.

16. The non-transitory, computer-readable medium of claim 11, wherein the operations further comprise:

prior to the determining whether the first dataset matches the previously analyzed dataset, generating encode values for one or more of the second plurality of fields included in the previously analyzed dataset.

17. A method, comprising:

receiving, by a data monitoring system, a first dataset that includes first data organized into a first plurality of fields, wherein the first data includes data records having data values for multiple fields within the first plurality of fields;

performing, by the data monitoring system, encoding operations on the first dataset to generate a set of encode values corresponding to the first dataset, wherein the set of encode values includes first and second encode values generated using different types of encoding and, for a particular field of the first plurality of fields, the performing the encoding operations includes:

selecting a particular one of a plurality of encoder modules based on a data type associated with the particular field; and encoding data included in the particular field of the first dataset, using the particular encoder module, to generate a first encode value;

determining, by the data monitoring system, whether the first dataset matches a previously analyzed dataset, wherein the previously analyzed dataset includes second data organized into a second plurality of fields, the second data includes data records having data values for multiple fields within the second plurality of fields, and the determining includes:

comparing the set of encode values to a previous set of encode values wherein the previous set of encode values incudes third and fourth encodes values generated using different types of encoding and the third encode value corresponds to a second field, of the second plurality of fields, of the previously analyzed dataset; and based on the comparing, generating an output value that is indicative of a similarity between the set of encode values and the previous set of encode values.

18. The method of claim 17, further comprising:

prior to determining whether the first dataset matches the previously analyzed dataset, comparing, by the data monitoring system, properties of a first schema associated with the first dataset to properties of a second schema associated with the previously analyzed dataset, wherein properties of the first schema include characteristics of the data records or the first plurality of fields; and in response to a determination that the first schema does not match the second schema, determining that the first dataset does not match the previously analyzed dataset.

19. The method of claim 17, wherein a type of encoding implemented by the encoding operations is numerical distribution encoding; wherein the encoding data included in the particular field of the first dataset includes calculating a first latent probability distribution corresponding to numerical data in the particular field; wherein the previous set of encode values includes a second latent probability distribution corresponding to numerical data included in a second field of the previously analyzed dataset; and wherein the comparing includes comparing the first and second latent probability distributions.

20. The method of claim 17, further comprising:

based on the output value, determining, by the data monitoring system, whether the first dataset matches the previously analyzed dataset.

* * * * *